(12) United States Patent  (10) Patent No.: US 8,130,359 B2
Damen  (45) Date of Patent: Mar. 6, 2012

(54) LITHOGRAPHIC APPARATUS AND A VACUUM CHAMBER

(75) Inventor: Johannes Wilhelmus Damen, Budel (NL)

(73) Assignee: ASML Netherlands B.V., Veldhoven (NL)

( * ) Notice: Subject to any disclaimer, the term of this patent is extended or adjusted under 35 U.S.C. 154(b) by 551 days.

(21) Appl. No.: 12/412,944

(22) Filed: Mar. 27, 2009

(65) Prior Publication Data

US 2009/0268180 A1 Oct. 29, 2009

Related U.S. Application Data

(60) Provisional application No. 61/064,830, filed on Mar. 28, 2008.

(51) Int. Cl.
G03B 27/52 (2006.01)
G03B 27/42 (2006.01)

(52) U.S. Cl. ............................................. 355/30; 355/53

(58) Field of Classification Search .................... 355/30, 355/53, 67; 359/819–821
See application file for complete search history.

(56) References Cited

U.S. PATENT DOCUMENTS 5,822,389 A * 10/1998 Uzawa et al. .................. 378/34

(Continued)

FOREIGN PATENT DOCUMENTS

JP 11-315933 A 11/1999
JP 2000-040659 A 2/2000

(Continued)

OTHER PUBLICATIONS

Japanese Office Action for Japanese Patent Application No. 2009-067140, mailed on Jul. 11, 2011.

*Primary Examiner* — Hung Henry Nguyen
(74) *Attorney, Agent, or Firm* — Pillsbury Winthrop Shaw Pittman LLP (57) ABSTRACT

A lithographic apparatus includes an illumination system configured to condition a radiation beam and a support constructed to support a patterning device. The patterning device is configured to impart the radiation beam with a pattern in its cross-section to form a patterned radiation beam. A substrate table is constructed to hold a substrate, and a projection system is configured to project the patterned radiation beam onto a target portion of the substrate. The projection system includes a vacuum chamber and a controller configured to control an actuator of an optical device arranged in the vacuum chamber. The vacuum chamber includes a hermetically sealed housing in which the controller is accommodated. The housing is provided with an electrical connection configured to electrically connect the controller to the optical device, and is connected to an exterior wall of the vacuum chamber via a fluid cooling channel configured to cool the controller.

20 Claims, 6 Drawing Sheets

U.S. PATENT DOCUMENTS

| | | | |
|---|---|---|---|
| 6,633,364 B2 * | 10/2003 | Hayashi | 355/53 |
| 6,791,766 B2 * | 9/2004 | Nishikawa | 359/811 |
| 6,842,221 B1 * | 1/2005 | Shiraishi | 355/30 |
| 7,307,262 B2 | 12/2007 | Van Dijsseldonk et al. | |

FOREIGN PATENT DOCUMENTS

| | | |
|---|---|---|
| JP | 2003-264390 A | 9/2003 |
| JP | 2006-179930 A | 7/2006 |
| WO | 2007/053442 | 5/2007 |

* cited by examiner

Fig. 8

LITHOGRAPHIC APPARATUS AND A VACUUM CHAMBER

CROSS-REFERENCE TO RELATED APPLICATIONS

This application claims the benefit of priority from U.S. Provisional Application Ser. No. 61/064,830, filed on Mar. 28, 2008, the entire content of which is incorporated herein by reference.

FIELD

The present invention relates to a lithographic apparatus and a vacuum chamber.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus might comprise a vacuum chamber wherein an optical device is arranged for directing, shaping and/or controlling the patterned radiation beam. By providing a controller for controlling an actuator of the optical device, the actuator can be driven according to a desired functionality. As real time requirements of the dynamic actuator performance increase, it is a desire to locate the controller physically near the actuator of the optical device. However, the vacuum conditions in the chamber wherein the optical device is arranged poses specific requirements for the electronics of the controller, thereby rendering the controller expensive and potentially less reliable.

SUMMARY

It is desirable to arrange a controller physically near an actuator of a optical device in a lithographic apparatus without substantially modifying the specifications of the controller.

According to an aspect of the invention, there is provided a lithographic apparatus that includes an illumination system configured to condition a radiation beam, and a support constructed to support a patterning device. The patterning device is configured to impart the radiation beam with a pattern in its cross-section to form a patterned radiation beam. The apparatus also includes a substrate table constructed to hold a substrate, and a projection system configured to project the patterned radiation beam onto a target portion of the substrate. The projection system includes a vacuum chamber, and a controller configured to control an actuator of an optical device arranged in the vacuum chamber. The actuator is configured to direct, shape and/or control the patterned radiation beam. The projection system also includes a hermetically sealed housing in which the controller is accommodated. The housing is arranged in the vacuum chamber and is provided with an electrical connection configured to electrically connect the controller to the actuator of the optical device. The housing is connected to an exterior wall of the vacuum chamber via a fluid cooling channel configured to cool the controller.

According to an aspect of the invention, there is provided a vacuum chamber and a controller configured to control an actuator of an optical device arranged in the vacuum chamber. The vacuum chamber includes a hermetically sealed housing in which the controller is accommodated. The housing is provided with an electrical connection configured to electrically connect the controller to the optical device. The housing is connected to an exterior wall of the vacuum chamber via a fluid cooling channel configured to cool the controller.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
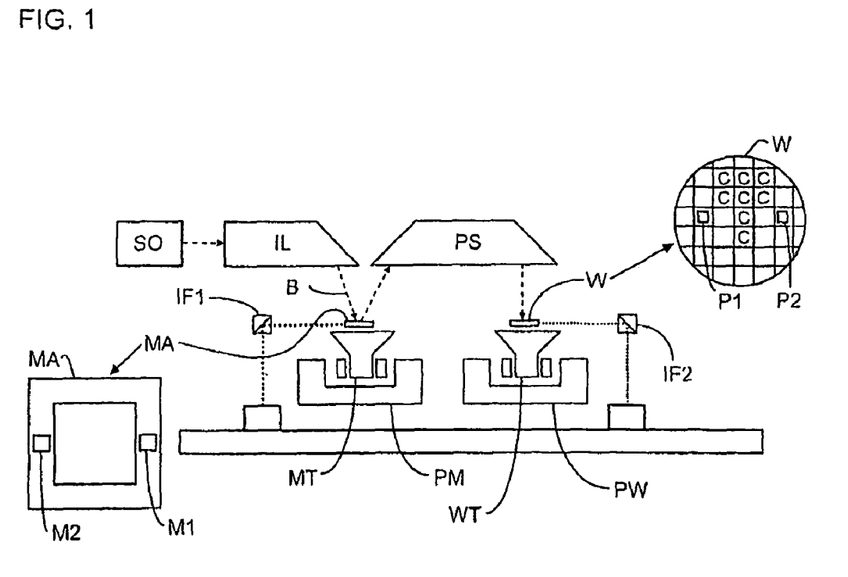
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation or visible light radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as desired. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if desired, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as desired after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
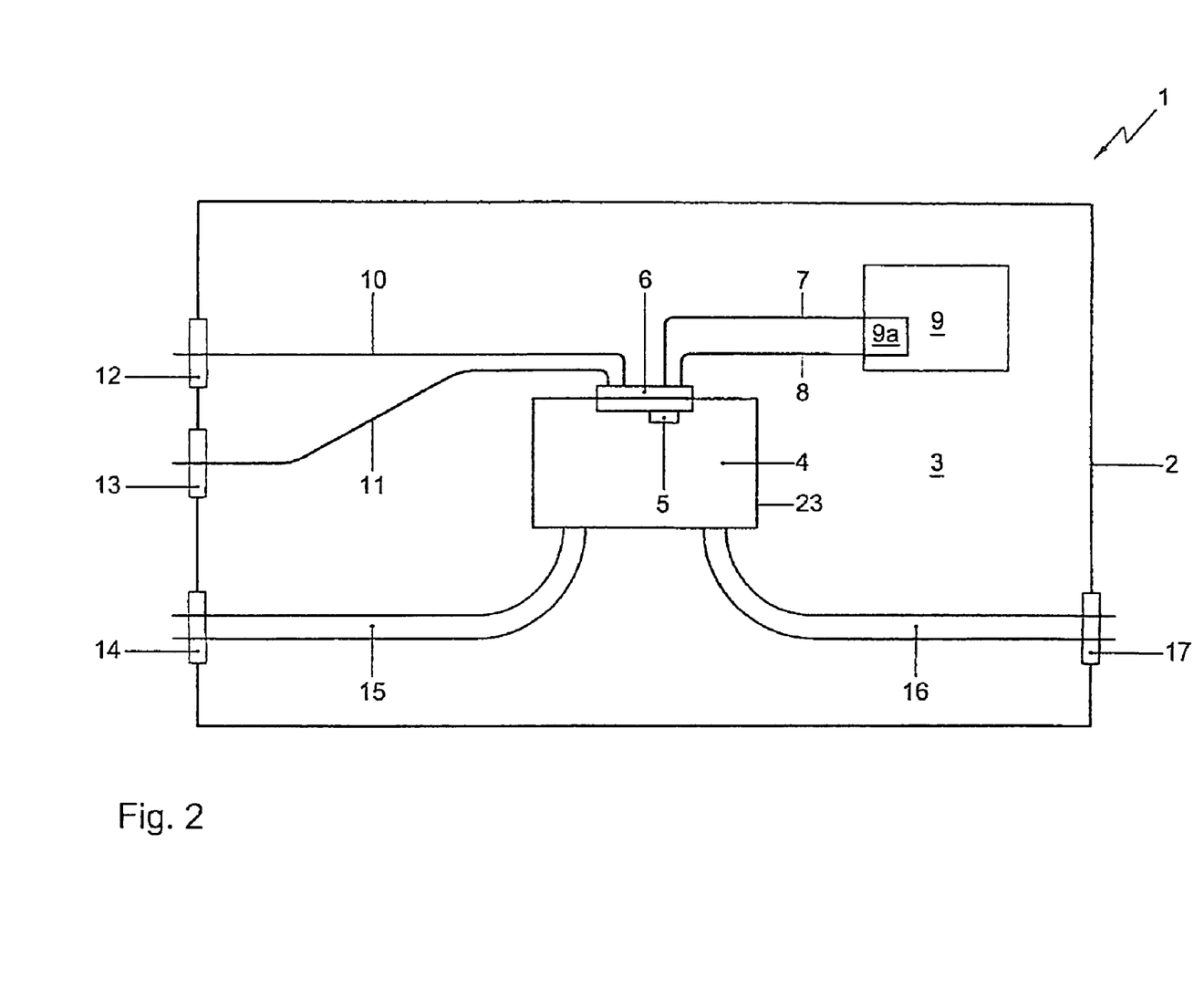
FIG. 2 depicts an embodiment of a vacuum chamber of the lithographic apparatus of FIG. 1.

FIG. 2 depicts a vacuum chamber 1 of a lithographic apparatus according to FIG. 1. In an embodiment, the vacuum chamber 1 is part of the projection system PS described above. The vacuum chamber 1 has an exterior wall 2 defining a boundary of an inner space 3 of the vacuum chamber 1. An optical device 9 is accommodated by the vacuum chamber 1 and is provided with a single or a multiple number of actuators 9a. The optical device 9, such as a collimator, is arranged for directing, shaping and/or controlling the patterned radiation beam. Further, in the vacuum chamber 1, a hermetically sealed housing 4 is located, near the optical device 9 comprising a controller 5 for controlling one or more actuators 9a of the optical device 9. The sealed housing 4 is provided with an electrical connection 6 for electrically connecting the controller 5 to the one or more actuators 9a of the optical device 9. Via the electrical connection 6 and data lines 7, 8 the controller 5 is connected to the optical device 9. Further, the housing 4 is connected to the exterior wall 2 of the vacuum chamber 1 via a fluid cooling channel 16 for cooling the controller 5. The fluid cooling channel 16 traverses the exterior wall 2 of the vacuum chamber 1 via a fluid interconnection element 17. Via a similar fluid interconnection element (not shown), the fluid cooling channel 16 enters the housing 4 through its wall 23.

By realizing a fluid cooling channel, the interior of the hermetically sealed housing 4, including electronic components of the controller can actively be cooled. In this context it is noted that heat transfer in a vacuum condition via conduction and radiation is relatively low. Therefore, in the absence of the fluid cooling channel, specific electric components may need to be used to perform the electrical functions of the controller 5 at extremely high temperatures. Further, by providing the fluid cooling channel, the sealed housing 4 can in principle be located at a desired location in the vacuum chamber, close to the optical device 9.

The sealed housing 4 is further connected to the exterior wall 2 of the vacuum chamber 1 via a pneumatic channel 15 for maintaining an at least partial atmospheric pressure in the sealed housing 4. By providing an at least partial atmospheric pressure in the sealed housing 4, degassing of electric components in the sealed housing 4 may be counteracted, thereby further reducing the specifications of the electric components. In principle, however, the sealed housing 4 can also be realized without pneumatic channel 15 that is connected to outside the vacuum chamber via a pneumatic interconnection element 14, e.g. by providing an initial at least partial pressure inside the housing 4 before sealing and placing the housing 4 in the vacuum chamber 1.

The sealed housing also comprises a further electrical connection for connecting the controller to the exterior wall 2 of the vacuum chamber 1. The further electrical connection comprises a single or multiple number of electrical conductors 10, 11 that are connected on the one end to the same electrical connection 6 as the data lines 7, 8 and to the other end to feed-through elements 12, 13 in the exterior wall 2. The further electrical connection may serve to supply power and/or exchange data between the controller 5 and an external processor (not shown).

The data lines 7, 8 that interconnect the controller 5 with the optical device 9 may serve to drive one or more actuators 9a and to transmit data between the optical device 9 and the controller 5, such as driving signals and/or sensor signals generated by sensor elements in the optical device 9, in the sealed housing 4 or in the inner space 3 of the vacuum chamber 1.

It is noted that not merely a single optical device but also a multiple number of optical devices can be controlled by the controller 5 in the sealed housing 4. Thereto, the multiple devices can electrically be connected to the controller 5 by an electrical connection as described above. Similarly, also other device types comprising one or more actuators can be controlled by the controller.

Figure 3:
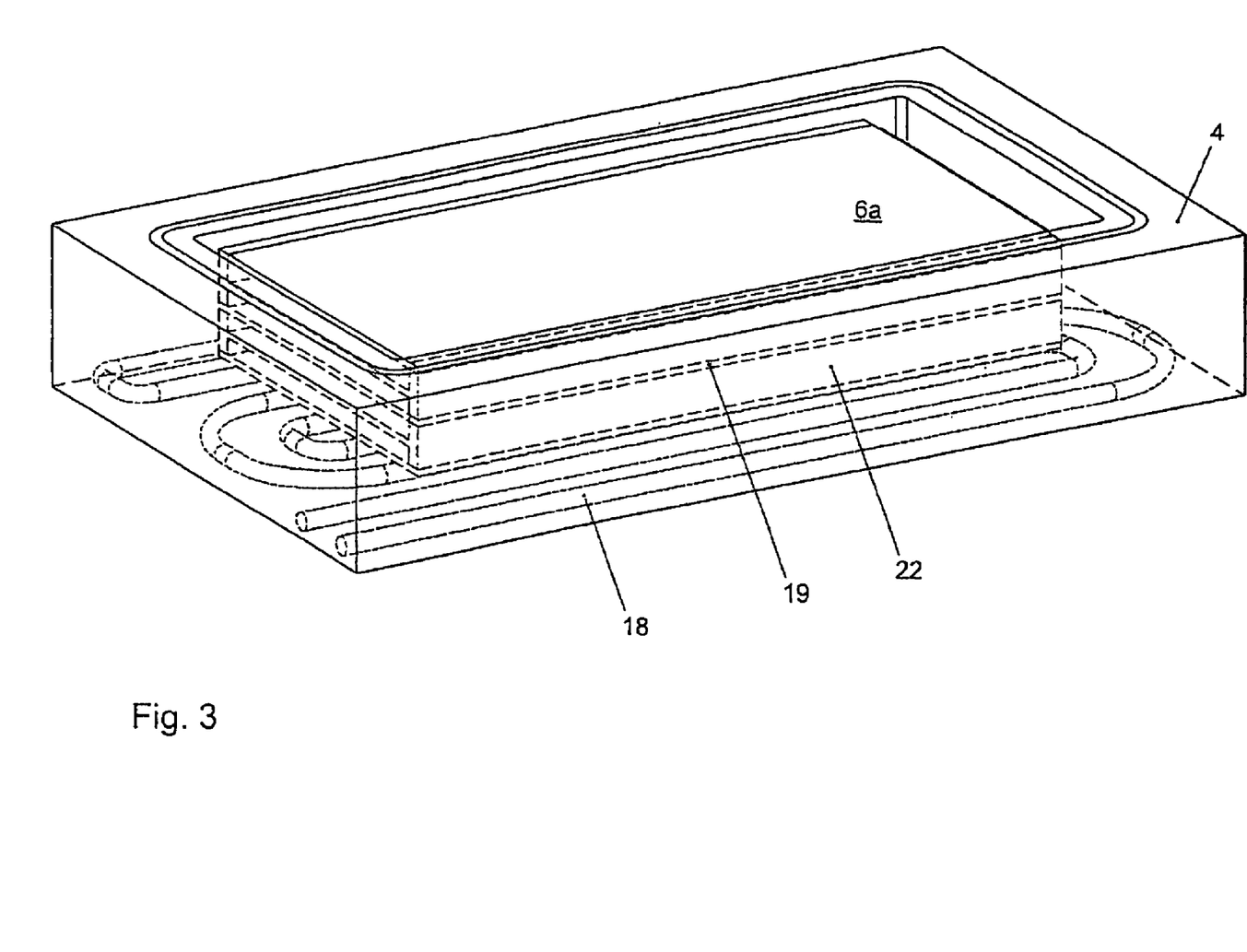
FIG. 3 depicts an embodiment of a sealed housing of the lithographic apparatus of FIG. 1.
Figure 4:
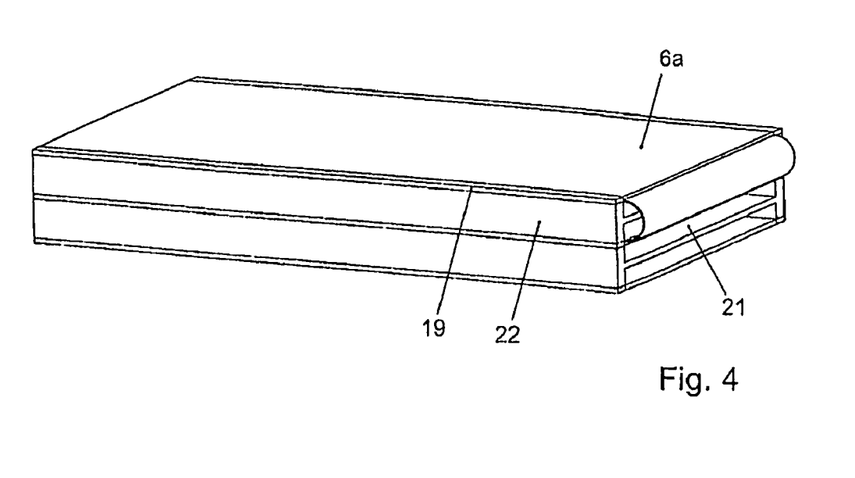
FIG. 4 depicts an embodiment of an assembly of a printed circuit board and a heat sink of the lithographic apparatus of FIG. 1.
Figure 5:
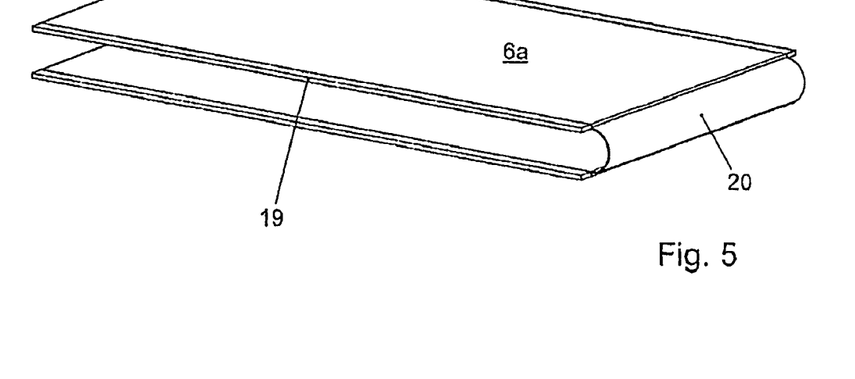
FIG. 5 depicts an embodiment of the printed circuit board of FIG. 4.
Figure 6:
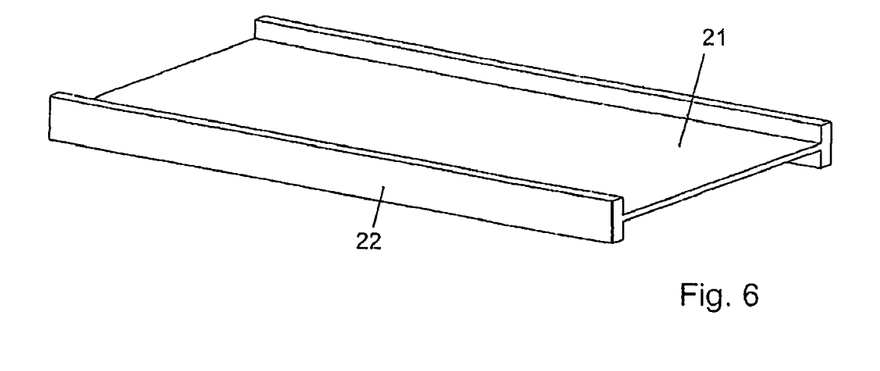
FIG. 6 depicts an embodiment of the heat sink of FIG. 4.

FIG. 3 depicts the sealed housing 4 in more detail. In the sealed housing 4, the controller has been accommodated, i.e., the controller has been placed inside the sealed housing 4. The controller 5 includes a printed circuit board 6a on which electric components have been mounted. In case a multiple number of printed circuit board elements are employed, these elements are interconnected via foils 20 (see FIG. 5). The printed circuit board elements may comprise fiber reinforced material, such as FR4 and/or flexible foil material. Further, side edges 19 of the printed circuit board have been metalized and connected to corresponding edges 22 of a heat sink 21 to drain heat that is generated by the electric components that have been mounted on the printed circuit board 6a. By thermodynamically connecting the controller or components thereof to a heat sink, the generated heat can be removed passively from the electric components to a location where the heat can be removed from the sealed housing 4. FIG. 4 depicts an assembly of a printed circuit board 6a and a heat sink 21, while FIG. 6 depicts an unassembled heat sink 21. In the embodiment shown in FIG. 3, the heat sink 21 also serves as a frame for supporting the printed circuit board 6a. The upper printed circuit board segment may further serve as the electrical connection 6 to electrical conduction lines outside the sealed housing 4, as described below.

The heat sink 21 is thermodynamically connected to a fluid cooling network 18 that is arranged at the bottom of the sealed housing 4. The fluid cooling network 18 is connected to the fluid cooling channel 16 that has been provided between the housing 4 and the exterior wall 2 of the vacuum chamber 1. By actively cooling the heat sink, the thermodynamically coupled controller is also cooled, thereby maintaining a predefined temperature range for the electric components. The cooling fluid may comprise a cooling liquid or a cooling gas.

Figure 7:
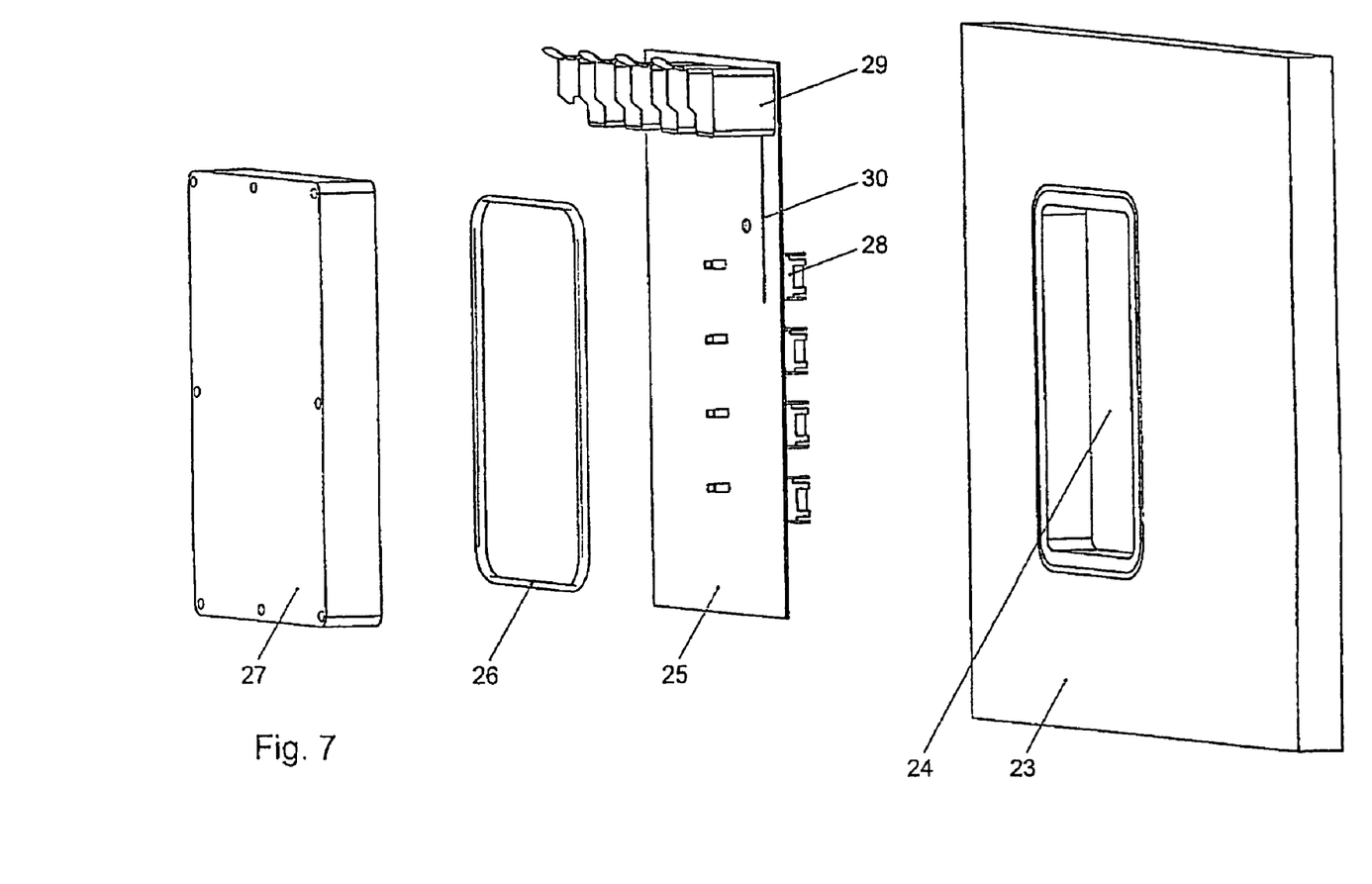
FIG. 7 depicts an electrical connection of the sealed housing of FIG. 3.

FIG. 7 depicts the electrical connection 6 of the sealed housing 4 in an exploded view. The electrical connection 6 includes a printed circuit board 25 covering a window 24 in the wall 23 of the housing 4. The printed circuit board might comprise a fiber reinforced material and/or flexible foil material. The printed circuit board is pressed against the housing wall 23 by means of a cover element or vacuum flange 27. In order to obtain a hermetically sealing, sealing rings 26 are applied between the vacuum flange 27 and the printed circuit board 25, and between the printed circuit board 25 and the wall 23, respectively.

In the printed circuit board 25 an electrical conductor 30 is embedded. Preferably, the embedded electrical conductor 30 extends substantially parallel with the flat sides of the printed circuit board 25, thereby minimizing leaking. Further, the electrical conductor 30 embedded in the printed circuit board 25 is electrically accessible from the opposite flat sides of the printed circuit board, via electrical contact points 28, 29, respectively.

By hermetically sealing a printed circuit board against the housing wall 23, the leak-tight properties of a printed circuit board are advantageously exploited to obtain an electrical vacuum feed through. Further, a relatively large number of electrical interconnection can be realized per vacuum flange area. It is noted however, that also other electrical connection types can be employed, e.g. a moulded or welded connector.

Figure 8:
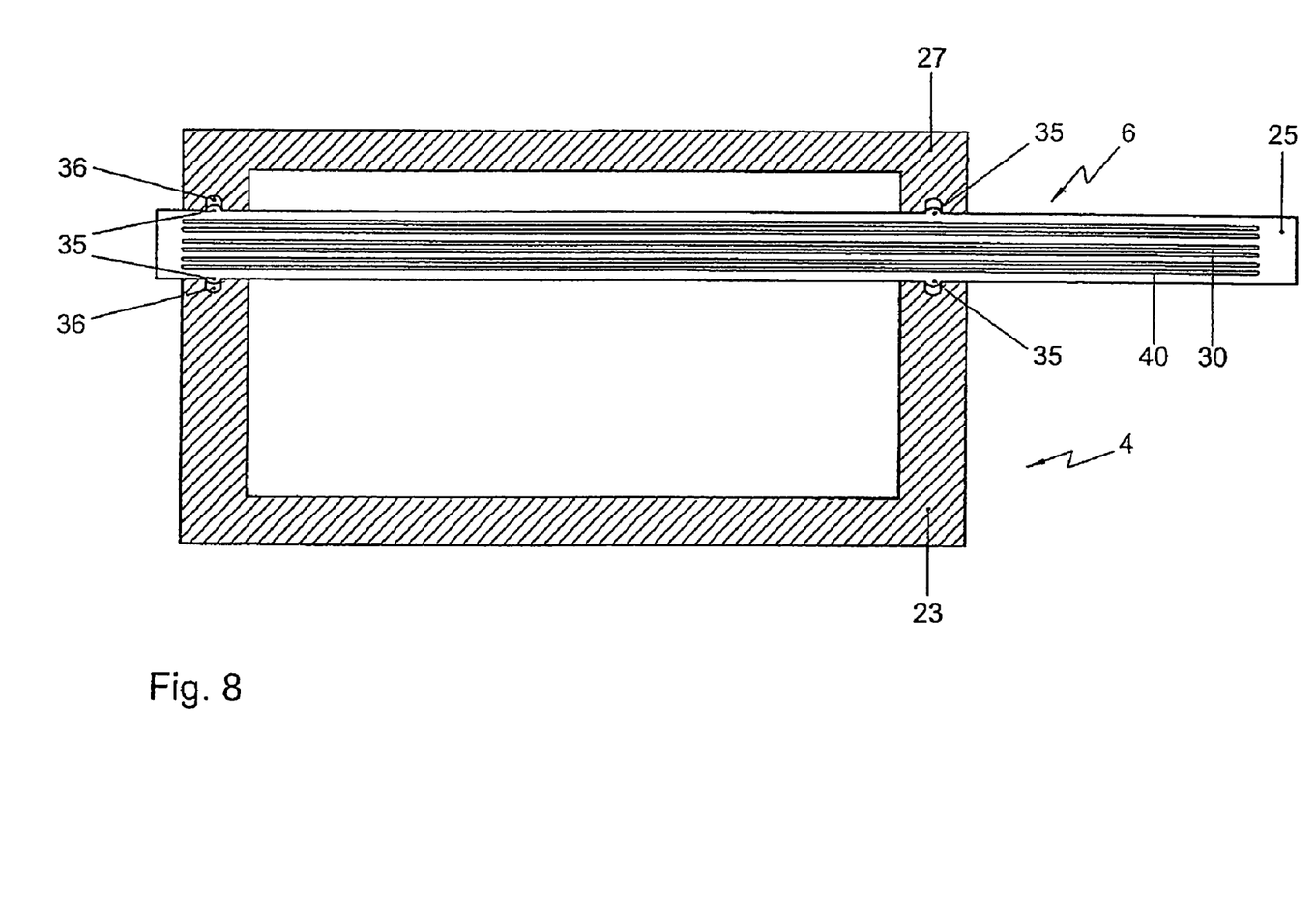
FIG. 8 depicts a cross-sectional view of an alternative electrical connection of the sealed housing of FIG. 3.

FIG. 8 depicts a cross-sectional view of an embodiment of the electrical connection 6 of the sealed housing 4. Here, the sealing rings 26 have been removed. The printed circuit board 25 comprises printed circuit board laminate material, e.g. polytetrafluoroethylene (PTFE), also called TEFLON®, as intermediate layers between the patterned circuits 30, 40 and on top and bottom of the printed circuit board 25. In an embodiment of the electrical connection 6, cold-flow characteristics of the printed circuit board 25 may be applied to obtain a hermetic seal. By pressing the vacuum flange 27 towards the walls 23 of the housing 4, the TEFLON® material on top and bottom of the printed circuit board 25 deforms, forming cold-flow draws 35. The cold-flow draws 35 seal the top and bottom surface of the printed circuit board 25 hermetically with the cover 27 and the side wall 23, respectively. By using a TEFLON® based printed circuit board in combination with a pressurized connection, a hermetic seal can thus be obtained, thereby rendering the use of sealing rings 26 superfluous. Instead of using PTFE, in principle also other printed circuit board laminates can be applied to form a cold-flow seal between the cover/printed circuit board interface and the printed circuit board/side wall interface. It is noted that in an embodiment, an O-ring may be applied to obtain a seal on a first section of the printed circuit board 25 and that a second section of the printed circuit board 25 may be sealed using the cold-flow characteristics of a printed circuit board laminate.

The cover 27 and/or the side wall 23 of the housing 4 may be provided with a recess 36 for receiving a corresponding cold-flow draw 35. Further, in principle, a multiple number of hermetic seals can be realized by squeezing the cover 27 against the side wall 23 of the housing and by selectively arranging recesses 36, such as grooves, in corresponding contacting portions of the cover 27 and the side wall 23, respectively. In addition, the housing 4 can be provided with hard stops (not shown) to counteract forces applied to the printed circuit board if the printed circuit board 25 is squeezed too much, i.e. to counteract the forces if a predefined deformation is exceeded.

In an embodiment, the controller 5 or components thereof may be mounted on the printed circuit board 25, 6a, thereby reducing the number of components that are used for providing the sealed housing 4. However, the controller or components thereof can also be mounted on a separate printed circuit board that is accommodated in the sealed housing 4.

The vacuum chamber 1 according to embodiments of the invention is not merely suited for application in a lithographic apparatus, but also in other devices, such as analyzing systems. Thereto, the controller is arranged for controlling an actuator accommodated in the vacuum chamber.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   an illumination system configured to condition a radiation beam;
   a support constructed to support a patterning device, the patterning device being configured to impart the radiation beam with a pattern in its cross-section to form a patterned radiation beam;
   a substrate table constructed to hold a substrate; and
   a projection system configured to project the patterned radiation beam onto a target portion of the substrate, the projection system comprising
      a vacuum chamber,
      a controller configured to control an actuator of an optical device arranged in the vacuum chamber, the actuator being configured to direct, shape and/or control the patterned radiation beam, and
      a hermetically sealed housing in which the controller is accommodated, the housing being arranged in the vacuum chamber and being provided with an electrical connection configured to electrically connect the controller to the actuator of the optical device, the housing being connected to an exterior wall of the vacuum chamber via a fluid cooling channel configured to cool the controller.

2. A lithographic apparatus according to claim 1, wherein the housing is further connected to the exterior wall of the vacuum chamber via a pneumatic channel configured to maintain an at least partial atmospheric pressure in the sealed housing.

3. A lithographic apparatus according to claim 1, wherein the housing comprises a further electrical connection configured to connect the controller to the exterior wall of the vacuum chamber.

4. A lithographic apparatus according to claim 1, wherein the electrical connection comprises a printed circuit board that is hermetically sealed against the housing and wherein an electrical conductor embedded in the printed circuit board is electrically accessible from opposite flat sides of the printed circuit board, via electrical contact points, respectively.

5. A lithographic apparatus according to claim 4, wherein the embedded electrical conductor extends substantially parallel with the flat sides of the printed circuit board.

6. A lithographic apparatus according to claim 4, wherein the controller or components thereof are mounted on the printed circuit board.

7. A lithographic apparatus according to claim 4, wherein the printed circuit board comprises fiber reinforced material and/or flexible foil material.

8. A lithographic apparatus according to claim 4, wherein a cold-flow draw of printed circuit board laminate material forms a hermetic seal with the printed circuit board.

9. A lithographic apparatus according to claim 1, wherein the controller or components thereof are thermodynamically connected to a heat sink.

10. A lithographic apparatus according to claim 9, wherein the heat sink is coupled to the fluid cooling channel and is actively cooled by the fluid cooling channel.

11. A vacuum chamber and a controller configured to control an actuator of an optical device arranged in the vacuum chamber, the vacuum chamber comprising a hermetically sealed housing in which the controller is accommodated, the housing being provided with an electrical connection configured to electrically connect the controller to the optical device, the housing being connected to an exterior wall of the vacuum chamber via a fluid cooling channel configured to cool the controller.

12. A vacuum chamber according to claim 11, wherein the housing is further connected to the exterior wall of the vacuum chamber via a pneumatic channel configured to maintain an at least partial atmospheric pressure in the sealed housing.

13. A vacuum chamber according to claim 11, wherein the housing comprises a further electrical connection configured to connect the controller to the exterior wall of the vacuum chamber.

14. A vacuum chamber according to claim 11, wherein the electrical connection comprises a printed circuit board that is hermetically sealed against the housing and wherein an electrical conductor embedded in the printed circuit board is electrically accessible from opposite flat sides of the printed circuit board, via electrical contact points, respectively.

15. A vacuum chamber according to claim 14, wherein the embedded electrical conductor extends substantially parallel with the flat sides of the printed circuit board.

16. A vacuum chamber according to claim 14, wherein the controller or components thereof are mounted on the printed circuit board.

17. A vacuum chamber according to claim 14, wherein the printed circuit board comprises fiber reinforced material and/or flexible foil material.

18. A vacuum chamber according to claim 14, wherein a cold-flow draw of printed circuit board laminate material forms a hermetic seal with the printed circuit board.

19. A vacuum chamber according to claim 11, wherein the controller or components thereof are thermodynamically connected to a heat sink.

20. A vacuum chamber according to claim 19, wherein the heat sink is coupled to the fluid cooling channel and is actively cooled by the fluid cooling channel.

* * * * *